US009338524B2

(12) United States Patent
Rossman (10) Patent No.: US 9,338,524 B2
(45) Date of Patent: May 10, 2016

(54) CABLE BACKPLANE SYSTEM HAVING A STRAIN RELIEF COMPONENT

(71) Applicant: Tyco Electronics Corporation, Berwyn, PA (US)

(72) Inventor: Jared Evan Rossman, Dover, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 56 days.

(21) Appl. No.: 14/251,148

(22) Filed: Apr. 11, 2014

(65) Prior Publication Data

US 2015/0296652 A1    Oct. 15, 2015

(51) Int. Cl.
*H02B 1/20*    (2006.01)
*H04Q 1/06*    (2006.01)
*H05K 7/14*    (2006.01)

(52) U.S. Cl.
CPC .............. *H04Q 1/06* (2013.01); *H05K 7/1449* (2013.01); *H05K 7/1492* (2013.01)

(58) Field of Classification Search
USPC ............ 361/788, 825, 826, 796, 800; 174/50; 211/26, 182
See application file for complete search history.

(56) References Cited

U.S. PATENT DOCUMENTS

| 5,194,020 | A | * | 3/1993 | Voltz ............................ 439/579 |
| 5,388,995 | A | * | 2/1995 | Rudy et al. ...................... 439/61 |
| 5,980,312 | A | * | 11/1999 | Chapman et al. ........... 439/540.1 |
| 7,762,846 | B1 | * | 7/2010 | Whiteman et al. ........ 439/607.23 |
| 8,449,330 | B1 | * | 5/2013 | Schroll et al. ............. 439/607.06 |
| 2004/0094328 | A1 | * | 5/2004 | Fjelstad et al. ................ 174/251 |
| 2009/0176400 | A1 | * | 7/2009 | Davis et al. ................... 439/352 |
| 2015/0034356 | A1 | * | 2/2015 | Ritter et al. ..................... 174/79 |

* cited by examiner

*Primary Examiner* — Hung S Bui (57) ABSTRACT

A cable rack for a cable backplane system includes a tray having a plurality of plates defining a frame and surrounding a raceway. Cable connector assemblies are held by the tray with each having a plurality of cables extending between at least two cable connectors and routed in the raceway. Each cable connector is positioned between and is supported by corresponding plates. At least one cable strain relief component is held by the tray. Each cable strain relief component is positioned between and is supported by corresponding plates of the tray independent of the cable connectors. Each cable strain relief component provides strain relief for the associated cables. Optionally, the cable connectors are loosely held by the tray and float relative to the tray with a predefined limited amount of movement relative to the tray and relative to the at least one cable strain relief component.

20 Claims, 8 Drawing Sheets

CABLE BACKPLANE SYSTEM HAVING A STRAIN RELIEF COMPONENT

BACKGROUND OF THE INVENTION

The subject matter herein relates generally to a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. Holding the cable connectors in proper position for mating with the line and switch cards is difficult. Additionally, during assembly, the cables are pulled on during routing of the cables within the system and the cable forces from pulling on the cables may cause the associated cable connectors to shift or move out of position, making connection to the line and switch cards difficult.

A need remains to prevent unintended movement of cables and connectors in a cable backplane system.

BRIEF DESCRIPTION OF THE INVENTION

In one embodiment, a cable rack for a cable backplane system is provided that includes a tray having a plurality of plates defining a frame and surrounding a raceway. Cable connector assemblies are held by the tray with each having a plurality of cables extending between at least two cable connectors and routed in the raceway. Each cable connector is positioned between and is supported by corresponding plates. At least one cable strain relief component is held by the tray. Each cable strain relief component is positioned between and is supported by corresponding plates of the tray independent of the cable connectors. Each cable strain relief component provides strain relief for the associated cables. Optionally, the cable connectors are loosely held by the tray and float relative to the tray with a predefined limited amount of movement relative to the tray and relative to the at least one cable strain relief component.

In another embodiment, a cable rack for a cable backplane system is provided that includes a tray having a plurality of plates defining a frame. The plates surround a raceway. The tray has a plurality of spacers coupled between corresponding plates. Cable connector assemblies are held by the tray. Each cable connector assembly has a plurality of cables extending between at least two cable connectors. The cables are routed in the raceway. Each cable connector is positioned between corresponding plates and corresponding spacers. The cable connectors are able to float relative to the tray with a predefined limited amount of movement to allow positioning of the cable connectors with respect to the tray. At least one cable strain relief component is held by the tray. Each cable strain relief component is positioned between corresponding plates and corresponding spacers of the tray. Each cable strain relief component is securely coupled to at least one of the plates and/or the spacers independent of the cable connectors. Each cable strain relief component provides strain relief for the associated cables. The cable connectors are able to float relative to the corresponding cable strain relief component.

In a further embodiment, a cable backplane system is provided that includes a backplane having a plurality of openings therethrough. A cable rack is coupled to a rear of the backplane. The cable rack includes a tray having a plurality of plates defining a frame. The plates surround a raceway. Cable connector assemblies are held by the tray. Each cable connector assembly has a plurality of cables extending between at least two cable connectors. The cables are routed in the raceway. Each cable connector is positioned between and supported by corresponding plates. The cable connectors are received in associated openings in the backplane. The cable connectors are able to float relative to the tray with a predefined limited amount of movement to allow positioning of the cable connectors with respect to the backplane. At least one cable strain relief component is held by the tray. Each cable strain relief component is positioned between and supported by corresponding plates of the tray independent of the cable connectors. Each cable strain relief component provides strain relief for the associated cables. The cable connectors are able to float relative to the corresponding cable strain relief component.

DETAILED DESCRIPTION OF THE INVENTION

Figure 1:
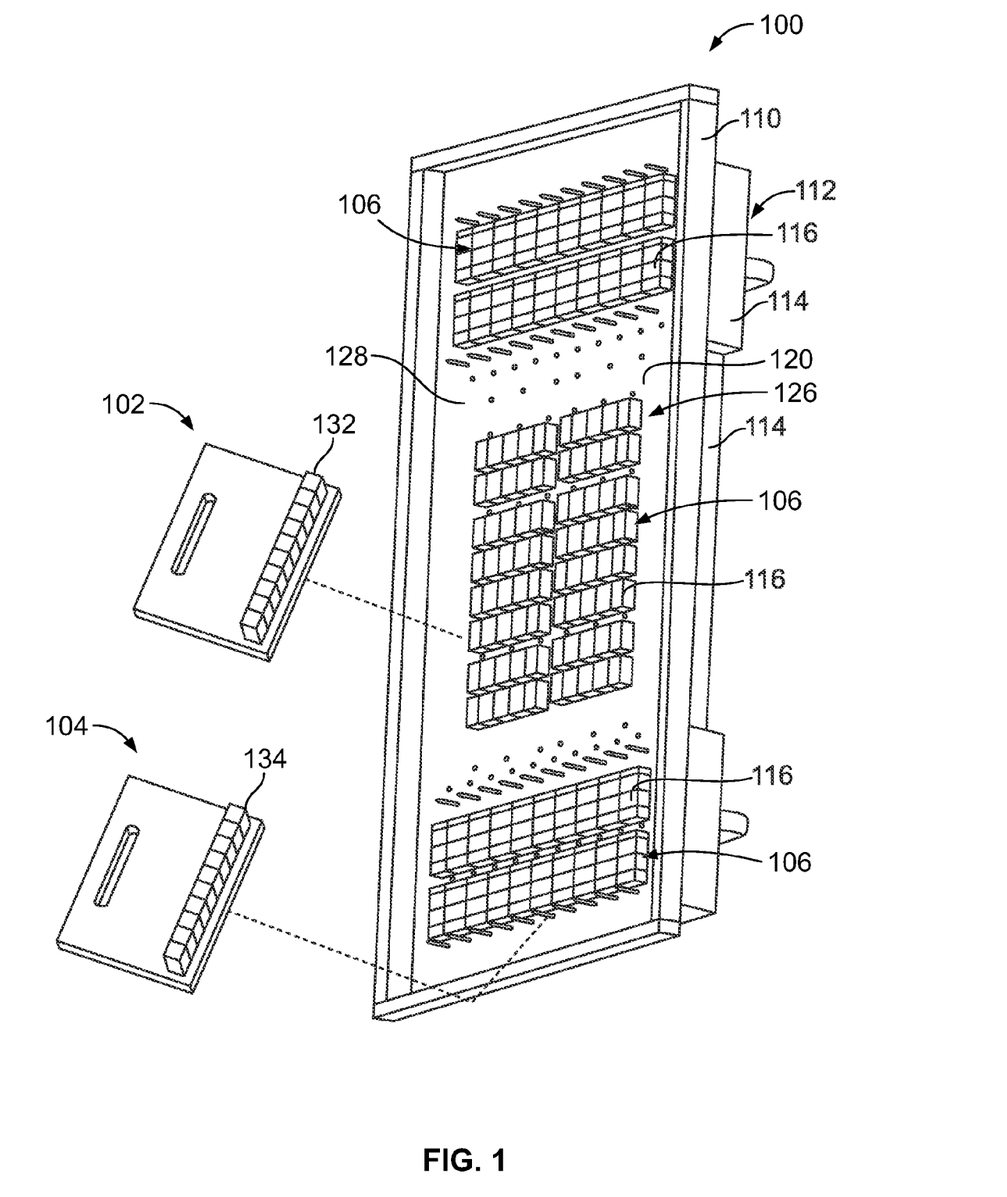
FIG. 1 is a front perspective view of a cable backplane system formed in accordance with an exemplary embodiment.
Figure 2:
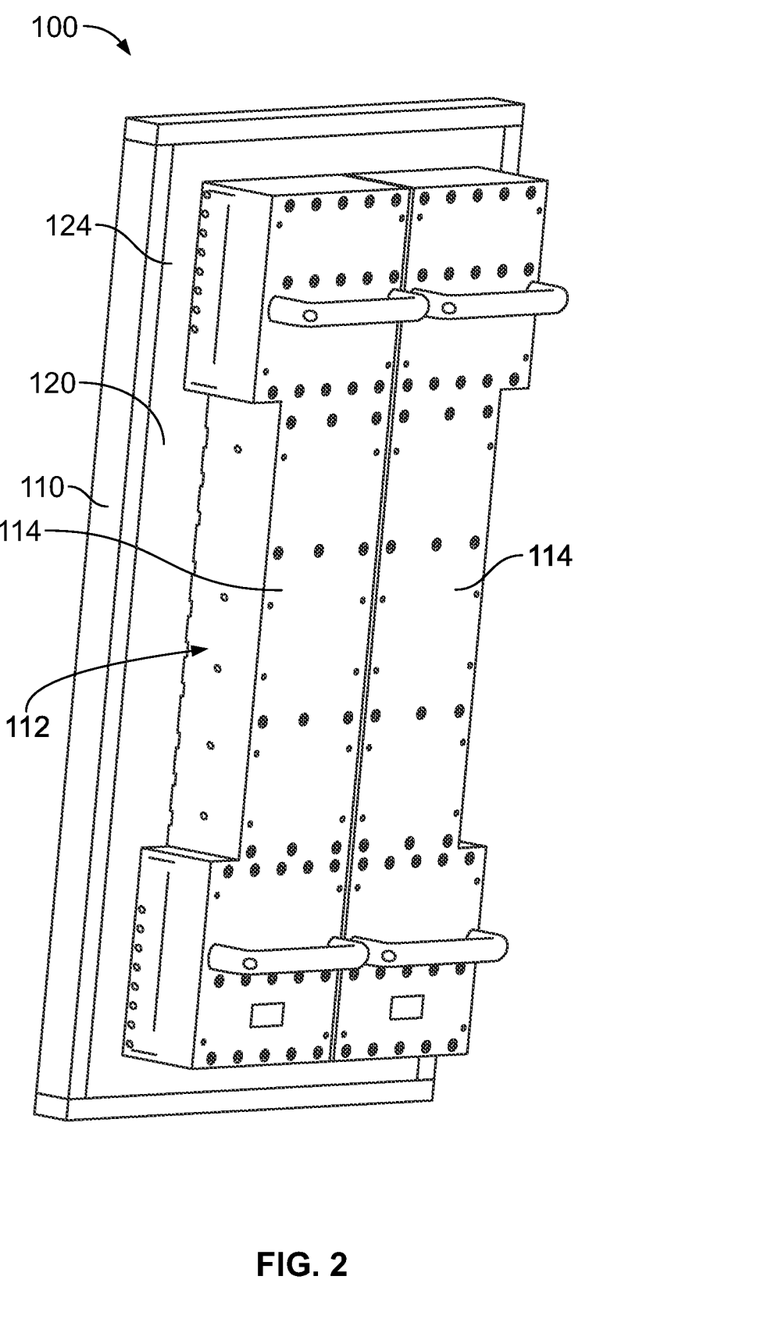
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 includes connector assemblies 106 that interconnect with daughtercards such as line cards 102 and switch cards 104. The cable backplane system 100 may be used to interconnect with other types of connectors and/or cards in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104. The structure manages and organizes the many cables interconnecting the cable connectors 116. The cable backplane system 100 includes strain relief features for the cables of the cable connector assemblies 106 to reduce or eliminate damage to the cables and/or the cable connectors 116. The strain relief features may also eliminate torqueing or moving the cable connectors 116 out of position prior to mating with the cards 102, 104. The strain relief features may make it easier for the cable connectors 116 to float for proper alignment and mating with the cards 102, 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the line cards 102 and the switch cards 104 coupled to the cable backplane system 100.

The cable backplane system 100 includes a cable rack 112 that supports and/or manages the cables of the cable connector assemblies 106. The cable rack 112 includes one or more cable trays 114 that are held together and extend along different portions of the cable backplane system 100. For example, as shown in FIG. 2, two cable trays 114 are provided defining a right half and a left half of the cable rack 112; however greater or fewer cable trays 114 may be provided in alternative embodiments. The cable trays 114 may be generally box-shaped and define raceways for the cables. The cable rack 112 supports a plurality of the cable connectors 116 which form parts of the cable connector assemblies 106.

In an exemplary embodiment, the cable connectors 116 need to be held in proper positions for mating with the line and switch cards 102, 104. The cable connectors 116 may be allowed a limited amount of movement or float in mutually perpendicular X, Y and/or Z directions (shown in FIG. 3) to allow fine alignment of the cable connectors 116 with the cards 102, 104, such as to obtain a nominal position for aligning to and mating with the corresponding connectors of the cards 102, 104. In an exemplary embodiment, the cable rack 112 includes one or more organizer plates 118 (shown in FIG. 3), such as a sheet metal plate with openings in proper locations for the cable connectors 116, which may be positioned along a front of the cable trays 114 to align and position the cable connectors 116. The organizer plates 118 are used as a cover or lid for the cable trays 114. Alternatively or additionally, a backplane 120 may be used to align and position the cable connectors 116. The organizer plates 118 may be used to position the cable connectors 116 for reception in the backplane 120 in addition to aligning the cable connectors 116 for mating with the line and switch cards 102, 104.

The backplane 120 may be a circuit board and may be manufactured from typical circuit board material, such as FR-4 material. Electrical components, such as power supplies, fans, fixed connectors, and the like may be mechanically and/or electrically connected to the backplane 120. Such electrical components may be electrically connected to traces of the backplane 120. The cable connectors 116 are not electrically connected to the backplane 120, as is typical of conventional backplanes, but rather the cable connectors 116 are interconnected by cables extending between the cable connectors 116. The backplane 120 may be manufactured from other materials in alternative embodiments, such as another dielectric or circuit board material or even a metal material, such as sheet metal, such as in embodiments that do not include the organizer plate 118 and/or embodiments that have no need for mounting other electrical components, such as fixed connectors, power supplies, cooling components, and the like on the backplane 120.

The backplane 120 and cable rack 112, with the cable connector assemblies 106, are coupled together to form the cable backplane system 100. The cable rack 112 is provided along a rear 124 of the backplane 120. The cable connectors 116 extend through connector openings 126 in the backplane 120 and are presented at a front 128 of the backplane 120 for mating with the line and switch cards 102, 104.

The organizer plate 118 and/or backplane 120 hold the cable connectors 116 in precise locations for mating with the line and/or switch cards 102, 104. The organizer plate 118 and/or backplane 120 have tight tolerances to control mating with the line and switch cards 102, 104. The line and switch cards 102, 104 have card connectors 132, 134, respectively, that mate with corresponding cable connectors 116. The cable connectors 116 need to be precisely positioned relative to the backplane 120 for mating with corresponding card connectors 132, 134. Optionally, the organizer plate 118 has tighter tolerances than the backplane 120 and is thus used to position the cable connectors 116 for mating with the card connectors 132, 134. In an exemplary embodiment, the limited amount of floating movement of the cable connectors 116 allows for precise alignment with the card connectors 132, 134. The strain relief features reduce or eliminate pulling on the cable connectors 116, which could force the cable connectors 116 to move or float into an incorrect position, thus making it easier to mate with the card connectors 132, 134 of the line and switch cards 102, 104.

Figure 3:
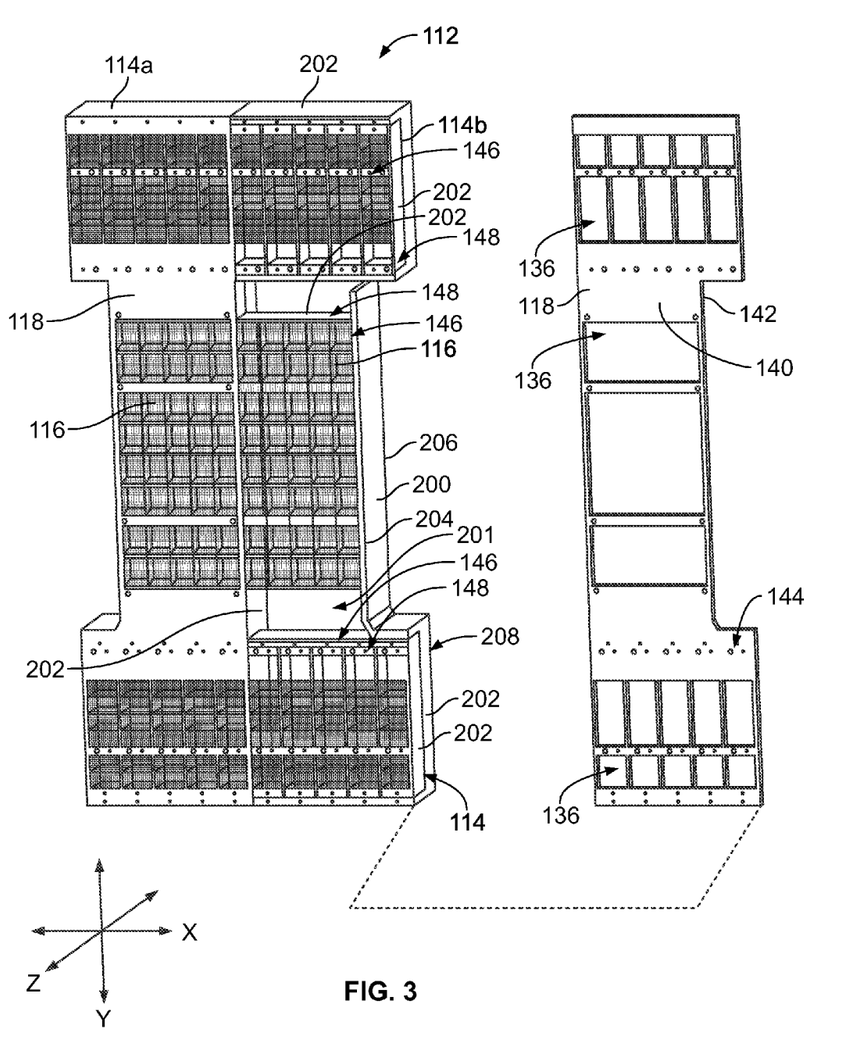
FIG. 3 is a partial assembled view of a cable rack of the cable backplane system and formed in accordance with an exemplary embodiment.

FIG. 3 is a partial assembled view of the cable rack 112 showing one of the organizer plates 118 poised for mounting to the cable tray 114 over the cable connectors 116. The organizer plate 118 includes connector channels 136 that receive the cable connectors 116 and/or portions of the cable trays 114. The connector channels 136 may be single openings that receive single cable connectors 116, or may be large openings that receive many cable connectors 116. As noted above, in alternative embodiments, the cable rack 112 may be provided without the organizer plates 118 and mounted directly to the backplane 120 (shown in FIGS. 1 and 2) without the organizer plates 118 positioned therebetween.

In an exemplary embodiment, the organizer plate 118 is a sheet metal plate having the connector channels 136 stamped out of the sheet metal plate in precise locations. The organizer plate 118 may be manufactured from other materials in alternative embodiments, such as dielectric materials including plastic material, FR-4 material, and the like.

The organizer plate 118 includes a front 140 and a rear 142. The rear 142 is mounted to the front of the cable tray 114. The organizer plate 118 may be secured to the cable tray 114 by fasteners, such as threaded fasteners. For example, the organizer plate 118 includes holes 144 therethrough that receive fasteners or other components used to assemble the cable rack 112. The holes 144 may define guide holes that receive guide features such as guide paddles or guide pins.

The cable trays 114 are coupled together into an I-shaped configuration having a first cable tray 114a defining a left half of the cable rack 112 (when viewed from the front) and a second cable tray 114b defining a right half of the cable rack 112. The cable rack 112 may have other shapes in alternative embodiments. In an exemplary embodiment, the cable rack 112 includes header frames 146 used to hold multiple cable connectors 116 together as a unit that can be loaded into the cable tray 114. The header frames 146 have multiple plates used to position the cable connectors 116 relative to one another to make routing and organizing of the cables and cable connectors 116 into the cable trays 114 easier for the assembler. The header frames 146 and corresponding cable connectors 116 define connector bricks 148 that are loaded into the cable trays 114 as units. The connector bricks 148 may be oriented vertically, horizontally or at other orientations. In alternative embodiments, rather than grouping the cable connectors 116 together as part of header frames 146, the cable connectors 116 may be individually held in the cable tray 114.

Each cable tray 114 includes a plurality of plates 202 defining a frame 200. The plates 202 surround a cavity or raceway 201 through which cables 152 (shown in FIG. 4) are routed. The raceways 201 may be open to one another to allow the cables 152 to be routed from one cable tray 114 into another cable tray 114. The plates 202 may define side walls of the cable tray 114, and may be referred to hereinafter as side walls 202. The side walls 202 extend between a front edge 204 and a rear 206 of the cable tray 114. At least one of the plates 202 may define a back wall 208 that covers the raceway 201 at the rear 206. The frame 200 is open at the front edge 204 between the side walls 202. The organizer plate 118 is coupled to the front edge 204 to cover or close the cable tray 114. The header frames 146, while holding the plurality of cable connectors 116, are loaded into the cable tray(s) 114, such as through the front. Once the header frames 146 are positioned in the corresponding tray 114, the cable connectors 116 are positioned at or forward of the front edge 204 for loading into the connector channels 136 of the organizer plate 118.

In an exemplary embodiment, the side walls 202 and back wall 208 are sheet metal pieces that are stamped, formed and coupled together, such as using fasteners or other connecting means. The sheet metal may be sufficiently thin to allow the frame 200 to have some flexibility for moving, twisting or otherwise manipulating the cable trays 114 into position relative to the organizer plate 118 to position the cable connectors 116 in the connector channels 136 in the organizer plate 118. Optionally, the cable trays 114a and 114b may be connected to each other with some freedom of movement or float in the connection to allow the cable trays 114a, 114b to move relative to one another to properly align the cable connectors 116 with the connector channels 136 in the organizer plate 118.

In an exemplary embodiment, the cable connectors 116 are movable relative to the header frames 146 to allow the cable connectors 116 to align with the corresponding connector channels 136 during assembly of the cable rack 112 and organizer plate 118 and/or connector openings 126 (shown in FIG. 1) during mounting of the cable rack 112 to the backplane 120 and/or the card connectors 132, 134 (shown in FIG. 1) during mating therewith. For example, the header frames 146 may allow a limited amount of movement or float in mutually perpendicular X, Y and/or Z directions to allow fine alignment of the cable connectors 116 with the connector channels 136. In an exemplary embodiment, the cable connectors 116 are configured to float within the connector channels 136 relative to the header frames 146 and/or cable trays 114 to obtain a nominal position for aligning to and mating with the corresponding card connectors 132, 134.

Figure 4:
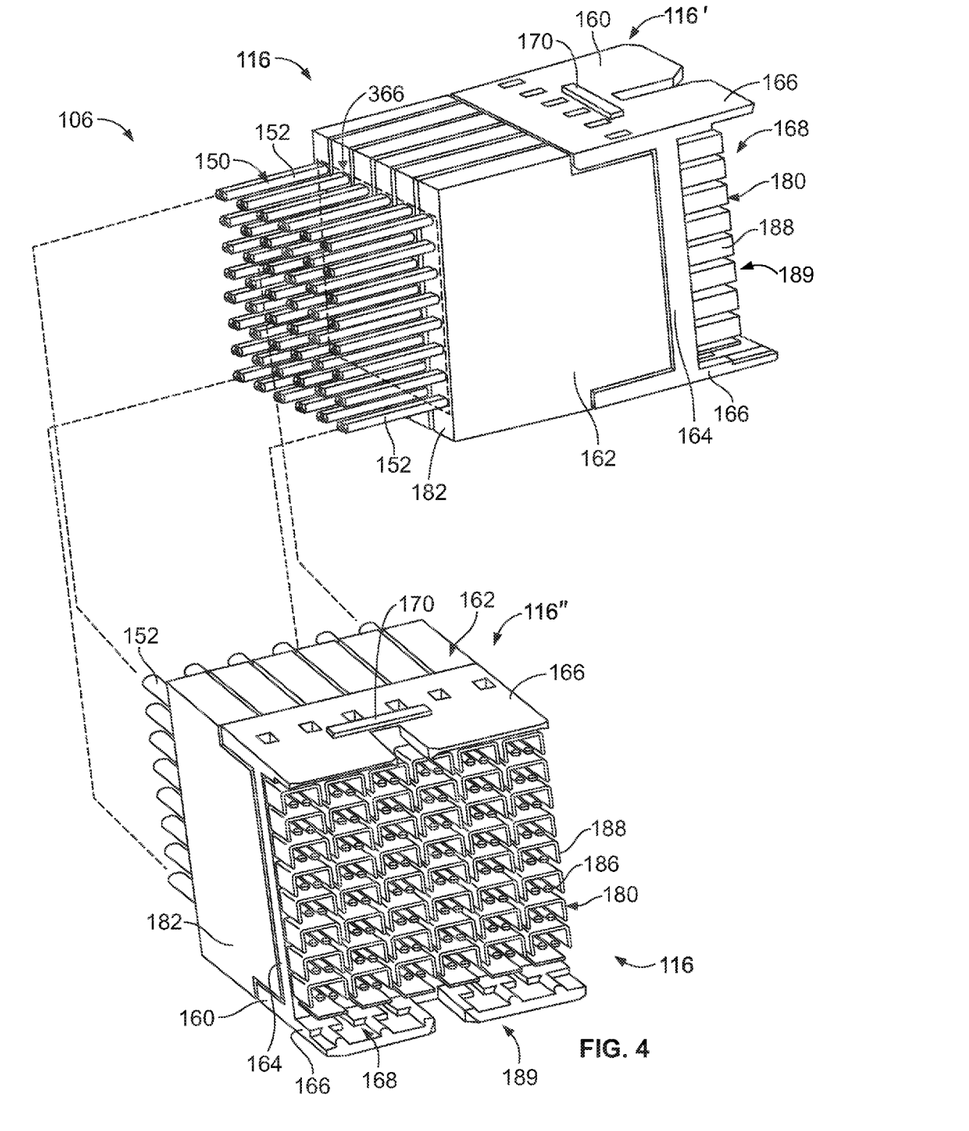
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header 160 holding a plurality of contact modules 162. The header 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header 160 has lugs 170 extending outward from the shroud walls 166. The lugs 170 are used to locate the cable connector 116 with respect to the corresponding cable tray 114 (shown in FIGS. 2 and 3).

Each of the contact modules 162 includes a plurality of cable assemblies 180 held by a support body 182. Each cable assembly 180 includes a pair of signal contacts 186 terminated to corresponding signal wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference. The cable assemblies 180 may be provided with greater or fewer signal contacts 186 in alternative embodiments. The cable assemblies 180 may be provided without the ground shields 188 in alternative embodiments. The cable assemblies 180 may be provided with different shaped ground shields 188 in alternative embodiments.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180. The contact modules 162 may be provided without the support bodies 182 in alternative embodiments.

Multiple contact modules 162 are loaded into the header 160. The header 160 holds the contact modules 162 in parallel such that the cable assemblies 180 are aligned in parallel columns. Any number of contact modules 162 may be held by the header 160 depending on the particular application. When the contact modules 162 are stacked in the header 160, the cable assemblies 180 may also be aligned in rows. The header 160 holds the signal contacts 186 at a mating end 189 of the header 160 configured for mating with a mating connector, such as a card connector.

Figure 5:
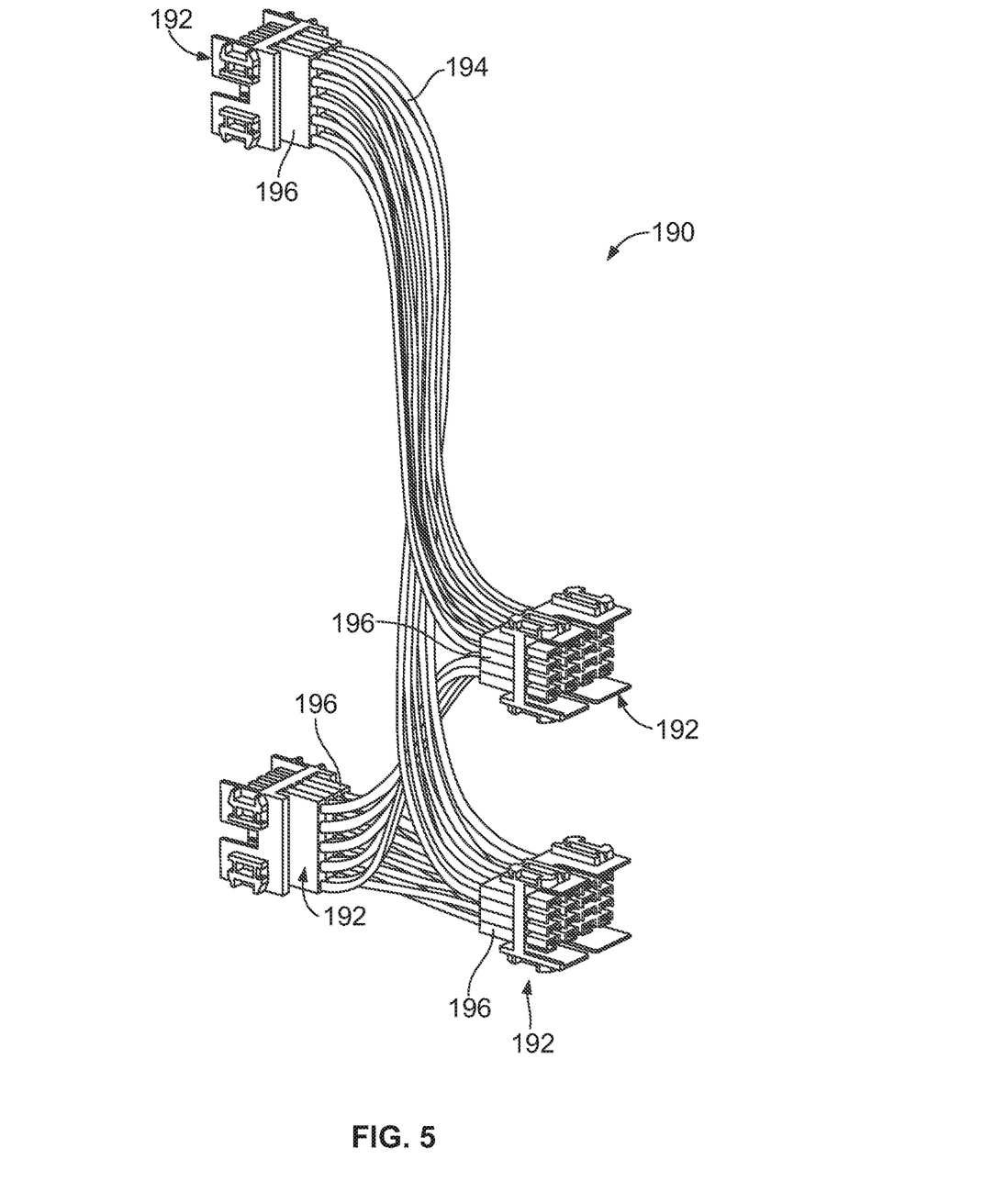
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
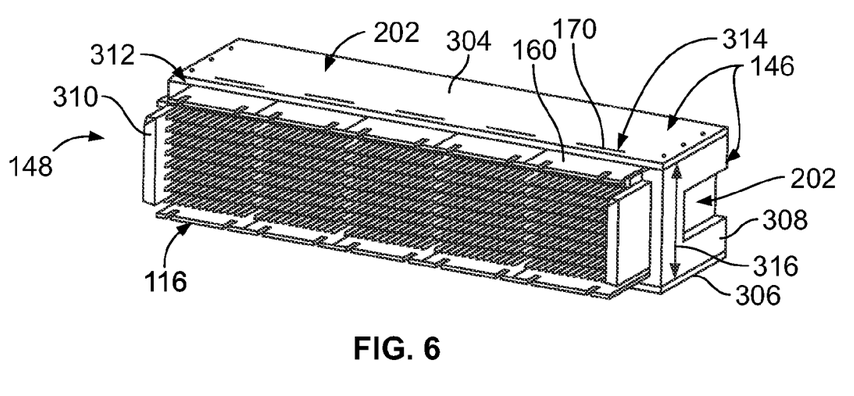
FIG. 6 is a front perspective view of a portion of the cable backplane system formed in accordance with an exemplary embodiment.
Figure 7:
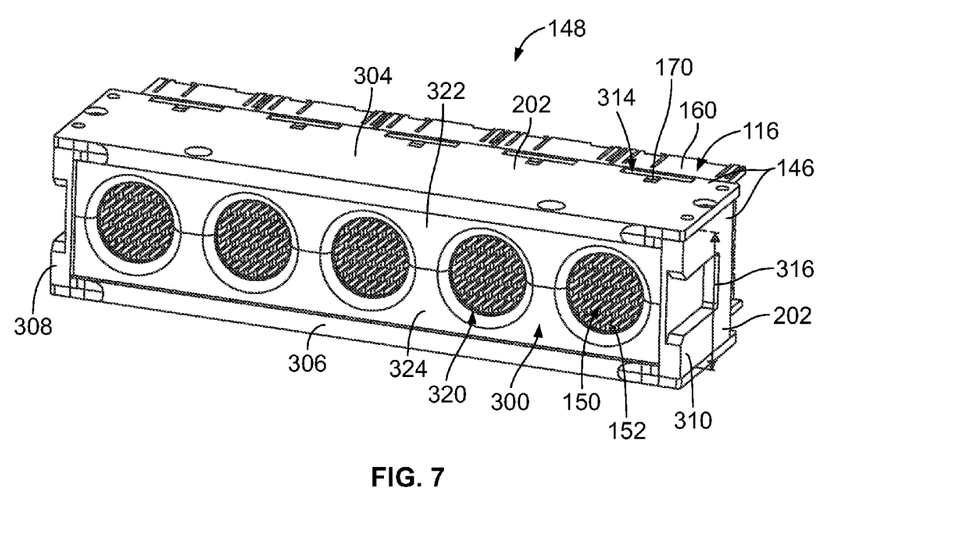
FIG. 7 is a rear perspective view of a portion of the cable backplane system showing a cable strain relief component formed in accordance with an exemplary embodiment.

FIG. 6 is a front perspective view of a connector brick 148 formed in accordance with an exemplary embodiment. FIG. 7 is a rear perspective view of the connector brick 148 showing a cable strain relief component 300 formed in accordance with an exemplary embodiment. In FIG. 7, the cables 152 are cut-off forward of the cable strain relief component 300 to illustrate the cable strain relief component 300. The connector brick 148 includes the header frame 146 that holds the cable connectors 116. The header frame 146 is defined by a plurality of the plates 202, which define portions of the cable tray 114 (shown in FIG. 3).

In the illustrated embodiment, the plates 202 include a pair of end plates 304, 306 and a pair of side plates 308, 310 extending between the end plates 304, 306. The side plates 308, 310 may be referred to hereinafter as side spacers 308, 310 or, simply, spacers 308, 310. The plates 304, 306, 308, 310 may have any size and shape appropriate to the configuration of the header frame 146, such as a size and shape that accommodates the number of cable connectors 116 associated with the connector brick 148. In the illustrated embodiment, the end plates 304, 306 are more panel-like while the side plates 308, 310 are more block-like. The side plates 308, 310 are positioned between the end plates 304, 306 to set the spacing between the end plates 304, 306. The end plates 304, 306 may be secured to the side spacers 308, 310, such as by threaded fasteners. Any of the plates 304, 306, 308, 310 may be secured to other plates 202, or side walls 202 (shown in FIG. 3), defining the tray 114.

A header opening 312 is defined between the end plates 304, 306 and the side plates 308, 310. The headers 160 of the cable connectors 116 are received in the header opening 312. The header opening 312 may be sized to receive any number of headers 160, such as by preselecting the end plates 304, 306 from different length end plates 304, 306. Optionally, the header frame 146 is sized to align the headers 160 in a single row within the header opening 312. For example, the side plates 308, 310 set the spacing between the end plates 304, 306 and define a width 316 of the header opening 312 between the end plates 304, 306. Optionally, the width 316 may be approximately equal to a single header width, such as slightly wider than the header width to allow a limited amount of floating movement between the end plates 304, 306.

In an exemplary embodiment, the end plates 304, 306 are generally planar plates having a rectangular shape; however, other shapes are possible in alternative embodiments. Optionally, at the rear, the end plates 304, 306 may be folded over into the interior of the header frame 146, such as to strengthen the end plates 304, 306 by increasing the thickness of the end plates 304, 306 at the rear. The end plates 304, 306 include elongated slots 314 that receive corresponding lugs 170 (shown in FIG. 4) of the headers 160. The slots 314 may be oversized relative to the lugs 170 to allow a limited amount of floating movement of the headers 160 relative to the header frame 146. As such, when the connector bricks 148 are held in the cable trays 114 (shown in FIG. 3), the headers 160 are movable relative to the cable trays 114, such as for alignment with the connector channels 136 of the organizer plate 118 (both shown in FIG. 3), the connector openings 126 of the backplane 120 (both shown in FIG. 1), and/or the mating connectors 132, 134 of the line and switch cards 102, 104 (all shown in FIG. 1).

The cable strain relief component 300 (FIG. 7) is provided at the rear of the header frame 146. The cable strain relief component 300 is mounted to the plates 202 independent of the cable connectors 116. For example, the cable strain relief component 300 may be securely coupled to the end plates 304, 306, such as by fasteners or by other means. Alternatively or additionally, the cable strain relief component 300 may be securely coupled to the side plates 308, 310. Any number of cable strain relief components 300 may be provided. Optionally, the cable strain relief component 300 may be associated with multiple cable bundles 150. For example, the header frame 146 may have a single cable strain relief component 300 that provides strain relief for the cables 152 associated with each of the cable connectors 116 held by the header frame 146.

The cable strain relief component 300 provides strain relief for the cables 152. For example, the cable strain relief component 300 supports the cables 152 rearward of the cable connectors 116. The cable strain relief component 300 may alleviate the effects of cable forces, such as from pulling, bending, routing, and the like, on the cables 152 exterior of the header frame 146. As such, the cable forces do not affect the ability of the cable connectors 116 to float in the header frame 146.

The cable strain relief component 300 includes an opening 320 sized to receive the cables 152 from the associated cable connector 116. In the illustrated embodiment, the cable strain relief component 300 receives cables 152 from multiple cable connectors 116, and thus includes multiple openings 320. Each opening 320 receives all of the cables 152 of a particular cable bundle 150 from the corresponding cable connector 116. Alternatively, multiple openings 320 may receive the cables 152 from a particular cable bundle 150. In an exemplary embodiment, the openings 320 have curved transitions at the entrance to and exit from the corresponding opening 320. The curved transitions allow the cables 152 to enter and exit the opening 320 without being damaged, such as from being bent too sharply or from being cut, which may occur at a sharp edge.

In an exemplary embodiment, the cable strain relief component 300 includes an upper member 322 and a lower member 324 discrete from the upper member 322. The upper and lower members 322, 324 capture the cables 152 therebetween to provide strain relief. Having the upper and lower members 322, 324 allows the cable strain relief component 300 to be loaded into the header frame 146 around (for example, from above and below) the cables 152. Having the upper and lower members 322, 324 allows assembly of the cable strain relief component 300 to the plates 202 after the cable connectors 116 are positioned in the header frame 146. Having the upper and lower members 322, 324 allows retro-fitting of existing header frames 146 with the cable strain relief component 300.

Figure 8:
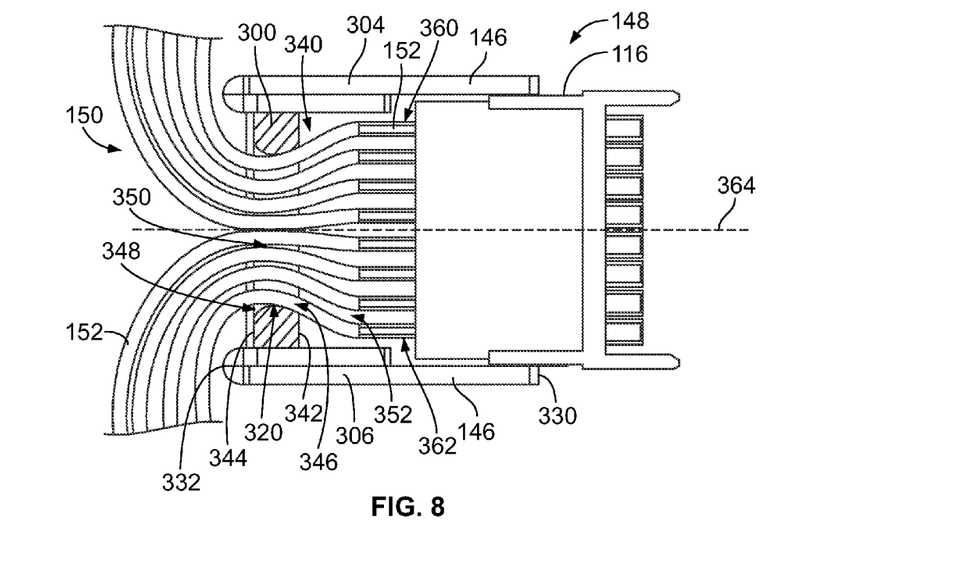
FIG. 8 is a partial sectional view of a portion of the cable backplane system showing a cable connector and the associated cable strain relief component.

FIG. 8 is a partial sectional view of the connector brick 148 showing one of the cable connectors 116 and associated cable strain relief component 300 positioned in the header frame 146. The end plates 304, 306 each extend between a front 330 and a rear 332. The cable connector 116 is positioned at or near the front 330. In an exemplary embodiment, the cable connector 116 extends forward of the front 330, such as for loading through the organizer plate 118 and/or the backplane 120 (both shown in FIG. 3). The cable strain relief component 300 is provided at or near the rear 332.

The cable strain relief component 300 is coupled to the plates 304, 306 independent of the cable connector 116. As noted above, the cable connector 116 is able to float relative to the plates 304, 306 and is able to float relative to the cable strain relief component 300. An intermediate space 340 is defined between the cable strain relief component 300 and the rear of the cable connector 116, where the cables 152 exit, or extend from, the cable connector 116.

The cable strain relief component 300 includes a front 342 facing the associated cable connector 116 and the intermediate space 340. The cable strain relief component 300 includes a rear 344, generally opposite the front 342, which faces the raceway 201 (shown in FIG. 3). For example, other side walls 202 (shown in FIG. 3) may define other portions of the raceway 201 rearward of the header frame 146. The front 342 defines an entrance 346 to the opening 320, and the rear 344 defines an exit 348 from the opening 320. The opening 320 has curved transitions at the entrance 346 and the exit 348 to allow the cables 152 to transition into and out of the opening 320. The cables 152 may extend from the exit 348 and are then routed (for example, bent perpendicular) into the raceway 201 away from the exit 348. If the cables 152 are pulled, the pulling forces are transferred to the cable strain relief component 300, and then to the plates 304, 306, rather than being transferred to the cable connector 116. Optionally, the cables 152 may be relatively loose in the intermediate space 340, thus allowing the cable connector 116 to float relative to the cable strain relief component 300.

In an exemplary embodiment, the opening 320 has a non-uniform diameter between the front 342 and the rear 344 of the cable strain relief component 300. For example, the diameter at the front 342 and the rear 344 is larger than at the mid-plane of the cable strain relief component 300 between the front 342 and the rear 344. The minimum diameter (for example, at the mid-plane) may be sized to accommodate the cable bundle 150, but may tightly hold the cables 152, such as by an interference fit. For example, at least some of the cables 152 may be compressed in order for the cable bundle 150 to fit in the opening 320. The pulling forces on the cables 152 may thus be imparted to the cable strain relief component 300 and isolated from the cable connector 116. The cable strain relief component 300 tightly gathers the plurality of cables 152 in the common opening 320 such that void spaces 350 between portions of the cables 152 passing through the cable strain relief component 300 are smaller than void spaces 352 between portions of the cables 152 in the intermediate space 340.

The plurality of cables 152 extend from the cable connector 116 in a matrix of rows and columns (illustrated in FIG. 4) of cables 152. The size and location of the opening 320 forces some or all of the cables 152 in the intermediate space 340 to bend or transition toward the opening 320. In other words, at least some the cables 320 are not able to pass straight from the cable connector 116 through the opening 320. For example, the cables 152 in outermost rows 360, 362 are transitioned inward toward a central axis 364 of the cable connector 116 to pass through the opening 320. Similarly, the cables 152 in outermost columns are transitioned inward to pass through the opening 320. The cables 152 exit the cable connector 116 from a cable exit zone 366 (shown in FIG. 4) into the intermediate space 340. The cable exit zone 366, which is defined along an outer perimeter of all of the cables 152 of the cable bundle 150, has a cross-sectional area that is greater than a cross-sectional area of the associated opening 320. Optionally, the cross-sectional area of the cable exit zone 366 may be rectangular, while the cross-sectional area of the opening 320 may be circular. Other shapes are possible in alternative embodiments. Because the cross-sectional area is reduced as the cables 152 pass through the opening 320, the cables 152 may be tightly held in the opening 320 by an interference fit, while being loosely gathered in the intermediate space 340, which allows the cable connectors 116 freedom of movement to float relative to the plates 202.

Figure 9:
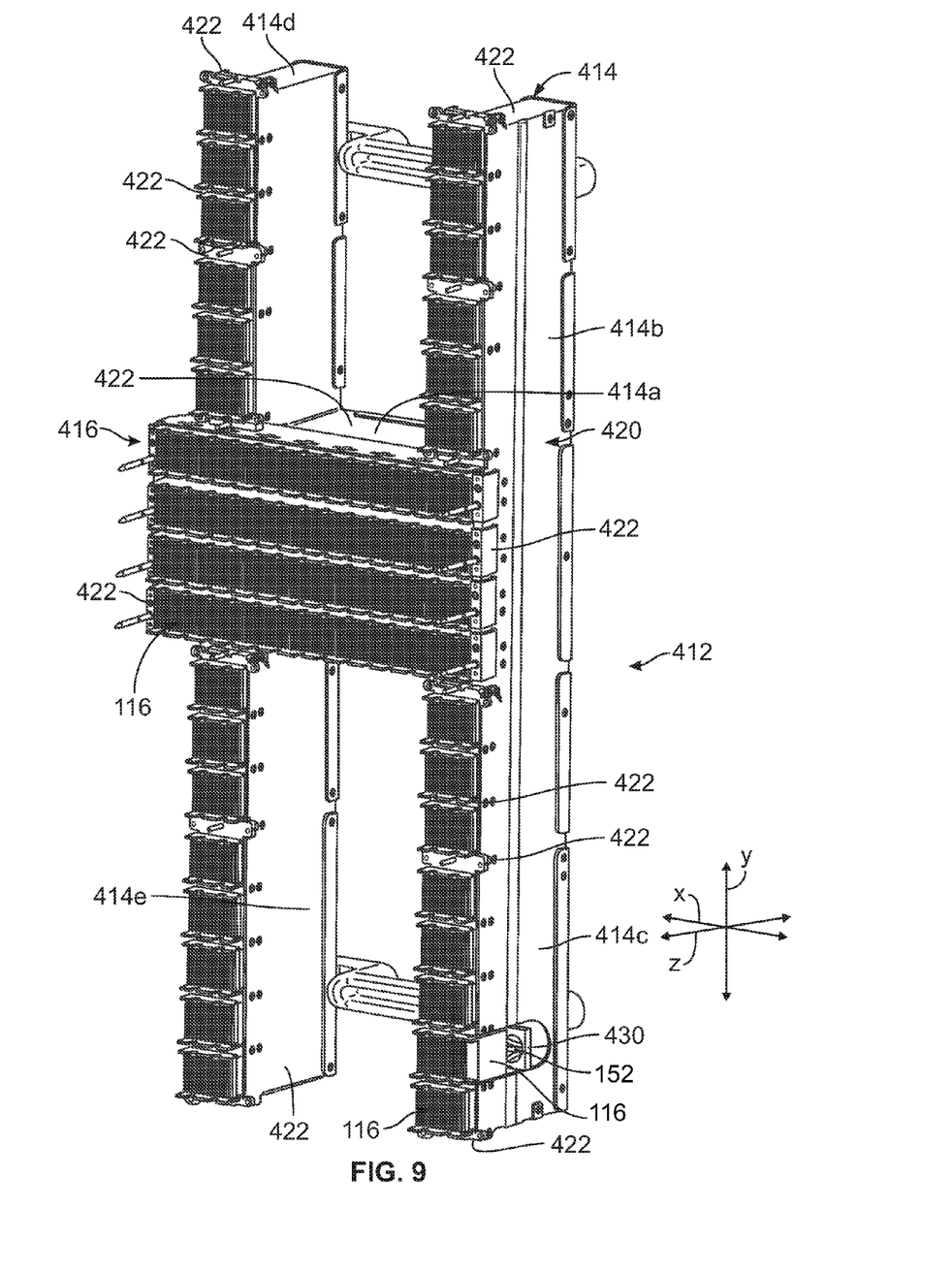
FIG. 9 illustrates another cable rack formed in accordance with an exemplary embodiment.

FIG. 9 illustrates another cable rack 412 formed in accordance with an exemplary embodiment. The cable rack 412 has a different shape and arrangement of the cable connectors 116 as compared to the cable rack 112 (shown in FIG. 3). The cable rack 412 includes one or more trays 414 connected together to form the cable rack 412. In the illustrated embodiment, the cable rack 412 includes five trays 414a, 414b, 414c, 414d and 414e; however any number of trays 414 may be used in alternative embodiments. The trays 414 are coupled together into an H-shaped configuration having the first tray 414a at a central location with the other trays 414b, 414c, 414d, 414e extending outward from the first tray 414a as legs. The cable rack 412 may have other shapes in alternative embodiments.

In an exemplary embodiment, the first tray 414a holds the cable connectors 116 that are mated with the card connectors 134 of the switch cards 104 (both shown in FIG. 1). The cable connectors 116 in the first tray 414a may be held together as bricks 416, which may be similar to the bricks 148 (shown in FIG. 6). The other trays 414b, 414c, 414d, 414e hold the cable connectors 116 that are mated with the card connectors 132 of the line cards 102 (both shown in FIG. 1).

Each tray 414 includes a frame 420 surrounding a raceway through which the cables 152 (shown in FIG. 4) are routed. The raceways are open to one another to allow the cables 152 to be routed from one tray 414 into another tray 414. The frame 420 includes a plurality of plates 422, which may define side walls of the frame 420 and may be referred to hereinafter as side walls 422. Optionally, the plates 422 may define portions of the bricks 416. Optionally, the plates 422 may define spacers between the side walls 422 and may be referred to hereinafter as spacers 422.

In an exemplary embodiment, cable strain relief components 430 (examples of which are shown in phantom in FIG. 9) may be coupled to corresponding plates 422 behind the cable connectors 116 to provide strain relief for the cables 152. For example, the cable strain relief components 430 may be used with the bricks 416 behind the cable connectors 116 associated with the tray 414a. The cable strain relief components 430 may be coupled to the side walls 422 behind the cable connectors 116 associated with the trays 414b, 414c, 414d, and 414e. The cable strain relief components 430 may be coupled to the spacers 422 behind the cable connectors 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable rack for a cable backplane system comprising:
a tray having a plurality of plates defining a frame including side walls and a back wall, the side walls extending between a front edge and the back wall, the plates surrounding and enclosing a raceway at the back wall;
cable connector assemblies held by the tray at or near the front end, each cable connector assembly having a plurality of cables extending between at least two cable connectors, the cables being routed from rears of the cable connectors through at least one cable strain relief into the raceway such that the cables are enclosed in the raceway by the side walls and back wall as the cables are routed between the corresponding cable connectors, each cable connector positioned between and supported by corresponding plates; and
the at least one cable strain relief component is held by the tray, each cable strain relief component positioned between and supported by corresponding plates of the tray independent of the cable connectors, each cable strain relief component providing strain relief for the associated cables.

2. The cable rack of claim 1, wherein the cable connectors are loosely held by the tray and permitted to float relative to the tray with a predefined limited amount of movement relative to the tray and relative to the at least one cable strain relief component.

3. The cable rack of claim 1, wherein the at least one cable strain relief component is fixed relative to the tray, the associated cable connector having a predefined limited amount of floating movement relative to the at least one cable strain relief component.

4. The cable rack of claim 1, wherein each cable strain relief component includes an opening sized to receive the cables from the associated cable connector.

5. The cable rack of claim 4, wherein the opening has curved transitions at an entrance to and an exit from the opening.

6. The cable rack of claim 4, wherein each cable strain relief component includes a front facing the associated cable connector and a rear facing the raceway, the front defining an entrance to the opening, the rear defining an exit from the opening.

7. The cable rack of claim 4, wherein the opening has a non-uniform diameter between a front and a rear of the cable strain relief component.

8. The cable rack of claim 4, wherein the cables exit the cable connector from a cable exit zone having a cross-sectional area greater than a cross-sectional area of the associated opening.

9. The cable rack of claim 1, wherein each cable strain relief component tightly gathers the plurality of cables from the associated cable connector in a common opening such that void spaces between the plurality of cables as the plurality of cables pass through the cable strain relief component are smaller than void spaces between the plurality of cables as the plurality of cables pass through an intermediate space defined between the cable strain relief component and the associated cable connector.

10. The cable rack of claim 1, wherein the plurality of cables extend from the associated cable connector in a matrix of rows and columns of cables, the cables in outermost rows being transitioned inward to pass through the opening, the cables in outermost columns being transitioned inward to pass through the opening.

11. The cable rack of claim 1, wherein each cable strain relief component includes an upper member and a lower member discrete from the upper member, the upper and lower members capturing the cables therebetween to provide strain relief.

12. The cable rack of claim 1, wherein each cable strain relief component includes a plurality of openings, each opening receiving all of the cables from the corresponding cable component.

13. The cable rack of claim 1, wherein the cable connectors are directly coupled to corresponding plates.

14. The cable rack of claim 1, wherein the tray further comprises spacers between corresponding plates, the cable connectors being secured to corresponding spacers, the cable strain relief component being separately secured to at least one of the plates and/or the spacers.

15. A cable rack for a cable backplane system comprising:
a tray having a plurality of plates defining a frame, the plates surrounding a raceway, the tray having a plurality of spacers coupled between corresponding plates;
cable connector assemblies held by the tray, each cable connector assembly having a plurality of cables extending between at least two cable connectors, the cables being routed in the raceway, each cable connector positioned between corresponding plates and corresponding spacers, the cable connectors being able to float relative to the tray with a predefined limited amount of movement to allow positioning of the cable connectors with respect to the tray; and at least one cable strain relief component held by the tray, each cable strain relief component positioned between corresponding plates and corresponding spacers of the tray, each cable strain relief component being securely coupled to at least one of the plates and/or the spacers independent of the cable connectors, each cable strain relief component providing strain relief for the associated cables, wherein the cable connectors are permitted to float relative to the corresponding cable strain relief component.

16. The cable rack of claim 15, wherein each cable strain relief component includes an opening sized to receive the cables from the associated cable connector.

17. The cable rack of claim 16, wherein the opening has a non-uniform diameter between a front and a rear of the cable strain relief component.

18. The cable rack of claim 15, wherein each cable strain relief component includes an upper member and a lower member discrete from the upper member, the upper and lower members capturing the cables therebetween to provide strain relief.

19. A cable backplane system comprising:
a backplane having a plurality of openings therethrough;
a cable rack coupled to a rear of the backplane, the cable rack comprising:
a tray having a plurality of plates defining a frame, the plates surrounding a raceway;
cable connector assemblies held by the tray, each cable connector assembly having a plurality of cables extending between at least two cable connectors, the cables being routed in the raceway, each cable connector positioned between and supported by corresponding plates, the cable connectors being received in associated openings in the backplane, the cable connectors being permitted to float relative to the tray with a predefined limited amount of movement to allow positioning of the cable connectors with respect to the backplane; and
at least one cable strain relief component held by the tray, each cable strain relief component positioned between and supported by corresponding plates of the tray independent of the cable connectors, each cable strain relief component providing strain relief for the associated cables, wherein the cable connectors are permitted to float relative to the corresponding cable strain relief component.

20. The cable backplane system of claim 19, wherein each cable strain relief component includes an opening sized to receive the cables from the associated cable connector, the opening having a non-uniform diameter between a front and a rear of the cable strain relief component.

* * * * *